United States Patent
Huang et al.

(10) Patent No.: US 9,723,768 B2
(45) Date of Patent: Aug. 1, 2017

(54) MULTICORE SHIELDED CABLE AND BRANCHING METHOD THEREFOR

(71) Applicant: Hitachi Metals, Ltd., Tokyo (JP)

(72) Inventors: Detian Huang, Hitachi (JP); Takanobu Watanabe, Hitachi (JP); Kimika Kudo, Kitaibaraki (JP); Haruyuki Watanabe, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/153,335

(22) Filed: May 12, 2016

(65) Prior Publication Data

US 2016/0353615 A1 Dec. 1, 2016

(30) Foreign Application Priority Data

May 28, 2015 (JP) ................................. 2015-108900

(51) Int. Cl.
*H05K 9/00* (2006.01)
*H01B 7/00* (2006.01)

(52) U.S. Cl.
CPC ............ *H05K 9/009* (2013.01); *H01B 7/009* (2013.01)

(58) Field of Classification Search
CPC .. H01B 7/0208; H01B 7/0216; H01B 7/0225; H01B 7/0241; H01B 7/228; H01B 9/024; H01B 9/02; H01B 9/04
See application file for complete search history.

(56) References Cited

U.S. PATENT DOCUMENTS

| | | | |
|---|---|---|---|
| 6,288,337 B1* | 9/2001 | Sato ..................... | H01B 7/0045 174/113 R |
| 2010/0307811 A1* | 12/2010 | Griffin ................... | H01B 11/12 174/350 |
| 2012/0234577 A1* | 9/2012 | Kim ........................ | H01B 9/04 174/113 R |
| 2014/0326480 A1* | 11/2014 | Hashimoto ............ | H01B 7/295 174/113 R |

FOREIGN PATENT DOCUMENTS

JP 2002-135937 A 5/2002
JP 2002135937 A * 5/2002

* cited by examiner

*Primary Examiner* — Hoa C Nguyen
*Assistant Examiner* — Amol Patel
(74) *Attorney, Agent, or Firm* — Roberts Mlotkowski Safran Cole & Calderon P.C.

(57) ABSTRACT

A multicore shielded cable includes a first core wire group composed of a plurality of assembled core wires, a first binding tape wound around an outer circumference of the first core wire group, a first braided shield provided around an outer circumference of the first binding tape, a second binding tape wound around an outer circumference of the first braided shield, a second core wire group composed of a plurality of core wires arranged around an outer circumference of the second binding tape, a third binding tape wound around an outer circumference of the second core wire group, a second braided shield provided around an outer circumference of the third binding tape, and a jacket provided around an outer circumference of the second braided shield.

6 Claims, 1 Drawing Sheet

MULTICORE SHIELDED CABLE AND BRANCHING METHOD THEREFOR

The present application is based on Japanese patent application No. 2015-108900 filed on May 28, 2015, the entire contents of which are incorporated herein by reference.

BACKGROUND OF THE INVENTION

1. Field of the Invention

This invention relates to a multicore shielded cable and a branching method therefor.

2. Description of the Related Art

Conventionally, in ultrasonic diagnoses, endoscopic examinations, etc., a multicore shielded cable having a core wire group including a plurality of assembled core wires, a braided shield provided around an outer circumference of the core wire group, and a jacket provided around an outer circumference of that braided shield has been being used.

When the multicore shielded cable is branched and wired, the jacket is removed to expose the braided shield, expand a mesh of the braided shield, draw some of the core wires through that mesh to the outside, and branch from the other core wires, to thereby leave the braided shield over the entire length of the other core wires and prevent degradation in the shielding property for the other core wires resulting from the branching and wiring (See e.g. JP-A-2002-135937).

SUMMARY OF THE INVENTION

When the conventional multicore shielded cable is branched and wired, however, since no braided shield can be left over the entire length of the some of the core wires drawn through the mesh of the braided shield to the outside, it is impossible to prevent degradation in the shielding property for the some of the core wires resulting from the branching and wiring, without using a separate braided sleeve, etc.

Incidentally, if a braided sleeve is used, the degradation in the shielding property for the some of the core wires resulting from the branching and wiring can be prevented by covering the some of the core wires drawn through the mesh of the braided shield to the outside with that braided sleeve, and solder connecting that braided sleeve to the braided shield.

However, because the solder connection is low in connection reliability, when stress is applied to a solder connecting portion by bending, etc. of the multicore shielded cable, cracks, etc. are likely to form at that solder connecting portion, leading to degradation in the shielding property for that solder connecting portion.

Further, because that solder connecting portion is larger than the other portion, when the branched portion is molded, a mold thickness at that solder connecting portion is thinner than a mold thickness at the other portion, thus also crack formation, etc. initiated at that solder connecting portion is likely to occur in the mold.

Accordingly, it is an object of the present invention to provide a multicore shielded cable and a branching method therefor, capable of preventing the degradation in the shielding property for all of core wires resulting from branching and wiring without using a separate braided sleeve, etc.

(1) According to an aspect of one embodiment of the invention, a multicore shielded cable comprises:

a first core wire group composed of a plurality of assembled core wires;

a first binding tape wound around an outer circumference of the first core wire group;

a first braided shield provided around an outer circumference of the first binding tape;

a second binding tape wound around an outer circumference of the first braided shield;

a second core wire group composed of a plurality of core wires arranged around an outer circumference of the second binding tape;

a third binding tape wound around an outer circumference of the second core wire group;

a second braided shield provided around an outer circumference of the third binding tape; and a jacket provided around an outer circumference of the second braided shield.

(2) According to an aspect of another embodiment of the invention, a method for branching a multicore shielded cable comprising a first core wire group composed of a plurality of assembled core wires, a first binding tape wound around an outer circumference of the first core wire group, a first braided shield provided around an outer circumference of the first binding tape, a second binding tape wound around an outer circumference of the first braided shield, a second core wire group composed of a plurality of core wires arranged around an outer circumference of the second binding tape, a third binding tape wound around an outer circumference of the second core wire group, a second braided shield provided around an outer circumference of the third binding tape, and a jacket provided around an outer circumference of the second braided shield comprises:

removing the jacket to expose the second braided shield, expand a mesh of the second braided shield, draw the first core wire group through that mesh to the outside, and branch the multicore shielded cable into a first path including the first core wire group and a second path including the second core wire group.

Further, following modification may be made.

(i) In the first core wire group the plurality of assembled core wires are stranded together, and the first binding tape is wound around the outer circumference of the first core wire group in an opposite direction with respect to a stranding direction of the first core wire group.

outer circumference of the second binding tape, and the third binding tape is wound around the outer circumference of the second core wire group in an opposite direction with respect to a winding direction of the second core wire group.

(Points of the Invention)

The present invention allows for providing the multicore shielded cable and the branching method therefor, capable of preventing the degradation in the shielding property for all of core wires resulting from the branching and wiring without using a separate braided sleeve, etc.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Below is described an exemplary embodiment of the present invention, in conjunction with the accompanying drawings.

Figure 1:
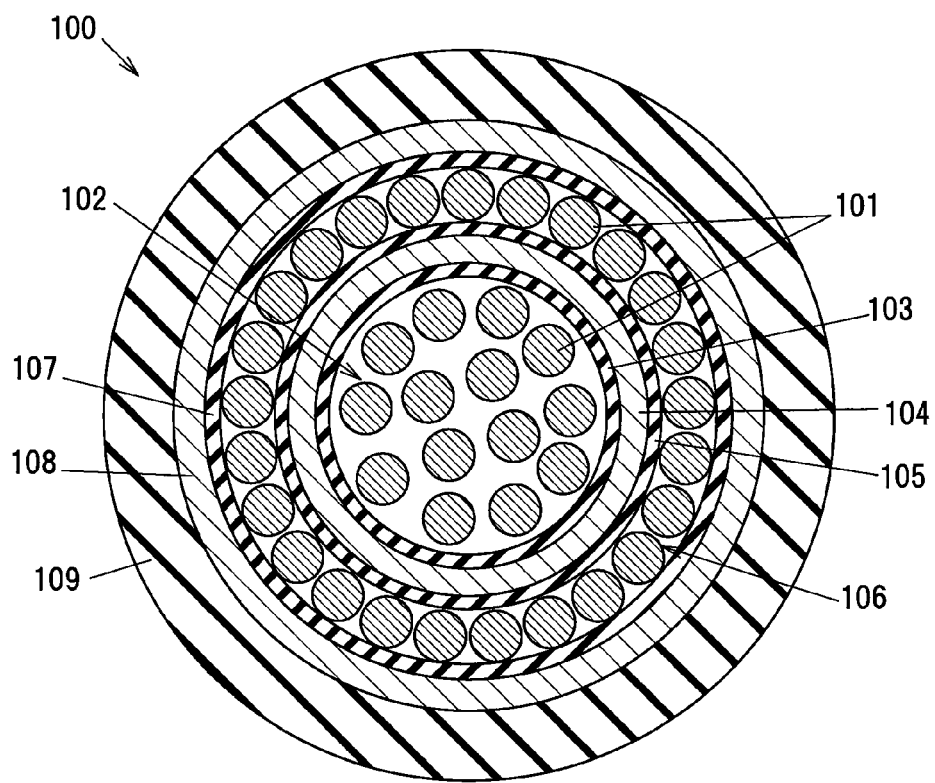
FIG. 1 is a schematic cross sectional view showing a multicore shielded cable according to the present invention.

As shown in FIG. 1, a multicore shielded cable 100 in an exemplary embodiment of the present invention includes a first core wire group 102, which is composed of a plurality of assembled core wires 101, a first binding tape 103, which is wound around an outer circumference of the first core wire group 102, a first braided shield 104, which is provided around an outer circumference of the first binding tape 103, a second binding tape 105, which is wound around an outer circumference of the first braided shield 104, a second core wire group 106, which is composed of a plurality of core wires 101 arranged around an outer circumference of the second binding tape 105, a third binding tape 107, which is wound around an outer circumference of the second core wire group 106, a second braided shield 108, which is provided around an outer circumference of the third binding tape 107, and a jacket 109, which is provided around an outer circumference of the second braided shield 108.

As the core wires 101, for example, electrically insulated wires are used each having a conductive wire formed of a conductor such as copper, a copper alloy, and an electrically insulating layer formed of an electrical insulator such as a polyethylene resin, a fluorine resin, and which is provided around an outer circumference of the conductive wire.

Note that the number of the core wires 101 in the first core wire group 102 and the number of the core wires 101 in the second core wire group 106 are matched to numbers of core wires, respectively, of a conventional connector, so that that conventional connector may be used, even when the numbers of core wires are large.

For example, although a conventional ultrasonic diagnostic equipment employs 128 channels in order to transmit a three-dimensional signal (a stereoscopic image signal), a recent year ultrasonic diagnostic equipment adopts 256 channels in order to transmit a four-dimensional signal (a stereoscopic moving image signal), so constructing each of the first core wire group 102 and the second core wire group 106 from the 128 core wires 101 makes it possible to use a connector being used in the conventional ultrasonic diagnostic equipment even in the recent year ultrasonic diagnostic equipment.

In the first core wire group 102, the plurality of core wires 101 may be stranded together, or may be arranged longitudinally relative to each other.

The first binding tape 103 is helically overlapped and wound around the outer circumference of the first core group 102. The first binding tape 103 is formed of an electrical insulator such as polytetrafluoroethylene (PTFE) resin or the like, and serves to constrain the first core group 102, and prevent damage to the first core group 102 due to contact between the first core group 102 and the first braided shield 104.

It should be noted that if in the first core wire group 102 the plurality of core wires 101 are stranded together, the first binding tape 103 is wound therearound in the opposite direction with respect to that stranding direction, and thereby also serves to correct the torsion of the first core wire group 102.

The first braided shield 104 and the second braided shield 108 are constructed by braiding together a plurality of strands each formed of a conductor such as copper, a copper alloy, but the first braided shield 104 may use a transversely wound shield, which is constructed by helically butting and winding a plurality of strands each formed of a conductor such as copper, a copper alloy or the like, or a metal foil shield, which is constructed by helically overlapping and winding a metal foil formed of a conductor such as copper, a copper alloy or the like.

The second binding tape 105 is helically overlapped and wound around the outer circumference of the first braided shield 104. The second binding tape 105 is formed of an electrical insulator such as polytetrafluoroethylene (PTFE) resin or the like, and serves to prevent fraying of the first braided shield 104, and prevent damage to the second core wire group 106 due to contact between the second core wire group 106 and the first braided shield 104.

In the second core wire group 106, the plurality of core wires 101 may be wound helically around the outer circumference of the second binding tape 105, or may be arranged longitudinally along the outer circumference of the second binding tape 105.

The third binding tape 107 is helically overlapped and wound around the outer circumference of the second core wire group 106. The third binding tape 107 is formed of an electrical insulator such as polytetrafluoroethylene (PTFE) resin or the like, and serves to constrain the second core wire group 106, and prevent damage to the second core wire group 106 due to contact between the second core wire group 106 and the second braided shield 108.

It should be noted that if in the second core wire group 106 the plurality of core wires 101 are wound helically around the outer circumference of the second binding tape 105, the third binding tape 107 is wound therearound in the opposite direction with respect to that winding direction, and thereby also serves to correct the torsion of the second core wire group 106.

The jacket 109 is formed, for example by extrusion coating of an electrical insulator such as a polyvinyl chloride resin, a fluorine resin or the like around the outer circumference of the second braided shield 108, and serves to protect the multicore shielded cable 100 from external flaws, etc.

Figure 2:
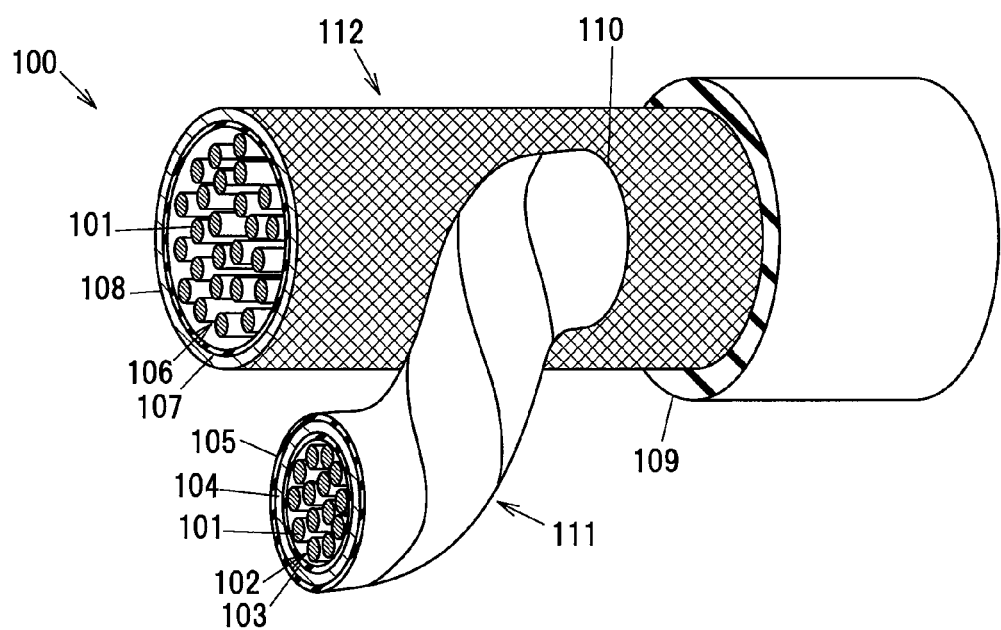
FIG. 2 is an explanatory diagram showing a branching process for the multicore shielded cable according to the present invention.

As shown in FIG. 2, when the multicore shielded cable 100 is branched and wired, the jacket 109 is removed to expose the second braided shield 108, expand a mesh 110 of the second braided shield 108, draw the first core wire group 102 through that mesh 110 to the outside, and branch the multicore shielded cable 100 into a first path 111 including the first core wire group 102 and a second path 112 including the second core wire group 106, to thereby be able to leave the first braided shield 104 or the second braided shield 108 over the entire length of all of the core wires 101 and prevent degradation in the shielding property for all of the core wires 101 resulting from the branching and wiring.

In addition, unlike when a braided sleeve is used, no degradation in the shielding property as caused at a solder connecting portion for that braided sleeve occurs, or when the branched portion is molded, no crack formation, etc. as initiated at that solder connecting portion occurs in the mold.

Furthermore, unlike when a braided sleeve is used, since no additional treatment at the time of branching and wiring is required, it is possible to remarkably enhance the workability at the time of branching and wiring.

As described above, the present invention allows for providing the multicore shielded cable 100 and the branching method therefor, capable of preventing the degradation in the shielding property for all of the core wires 101 resulting from the branching and wiring without using a separate braided sleeve, etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A multicore shielded cable, comprising:
    a first core wire group composed of a plurality of assembled core wires;
    a first binding tape wound around an outer circumference of the first core wire group;
    a first braided shield provided around an outer circumference of the first binding tape;
    a second binding tape wound around an outer circumference of the first braided shield;
    a second core wire group composed of a plurality of core wires arranged around an outer circumference of the second binding tape;
    a third binding tape wound around an outer circumference of the second core wire group;
    a second braided shield provided around an outer circumference of the third binding tape; and
    a jacket provided around an outer circumference of the second braided shield,
    wherein one end of the first core wire group is drawn through a mesh of the second braided shield to the outside such that the multicore shielded cable is branched into a first path including the first core wire group and a second path including the second core wire group.

2. The multicore shielded cable, according to claim 1, wherein in the first core wire group the plurality of assembled core wires are stranded together, and the first binding tape is wound around the outer circumference of the first core wire group in an opposite direction with respect to a stranding direction of the first core wire group.

3. The multicore shielded cable, according to claim 1, wherein in the second core wire group the plurality of core wires are wound helically around the outer circumference of the second binding tape, and the third binding tape is wound around the outer circumference of the second core wire group in an opposite direction with respect to a winding direction of the second core wire group.

4. A method for branching a multicore shielded cable comprising a first core wire group composed of a plurality of assembled core wires, a first binding tape wound around an outer circumference of the first core wire group, a first braided shield provided around an outer circumference of the first binding tape, a second binding tape wound around an outer circumference of the first braided shield, a second core wire group composed of a plurality of core wires arranged around an outer circumference of the second binding tape, a third binding tape wound around an outer circumference of the second core wire group, a second braided shield provided around an outer circumference of the third binding tape, and a jacket provided around an outer circumference of the second braided shield, the method comprising removing the jacket to expose the second braided shield, expand a mesh of the second braided shield, draw the first core wire group through that mesh to the outside, and branch the multicore shielded cable into a first path including the first core wire group and a second path including the second core wire group.

5. The method for branching a multicore shielded cable, according to claim 4, wherein in the first core wire group the plurality of assembled core wires are stranded together, and the first binding tape is wound around the outer circumference of the first core wire group in an opposite direction with respect to a stranding direction of the first core wire group.

6. The method for branching a multicore shielded cable, according to claim 4, wherein in the second core wire group the plurality of core wires are wound helically around the outer circumference of the second binding tape, and the third binding tape is wound around the outer circumference of the second core wire group in an opposite direction with respect to a winding direction of the second core wire group.

* * * * *